United States Patent [19]

Holzl et al.

[11] Patent Number: 4,716,064
[45] Date of Patent: Dec. 29, 1987

[54] COMPOSITE STIFF LIGHTWEIGHT STRUCTURE AND METHOD FOR MAKING SAME

[75] Inventors: Robert A. Holzl, LaCanada; Robert E. Benander, Sylmar, both of Calif.

[73] Assignee: Air Products and Chemicals, Inc., Allentown, Pa.

[21] Appl. No.: 793,828

[22] Filed: Oct. 31, 1985

[51] Int. Cl.$^4$ .............................................. B32B 3/12
[52] U.S. Cl. ..................................... 428/73; 428/117; 428/119; 428/698
[58] Field of Search .............. 428/116, 117, 118, 119, 428/120, 698, 73

[56] References Cited

U.S. PATENT DOCUMENTS

| | | | |
|---|---|---|---|
| 2,477,852 | 8/1949 | Bacon | 428/116 |
| 3,210,233 | 10/1965 | Kummer et al. | 428/920 X |
| 3,325,266 | 6/1967 | Stong | 428/120 X |
| 3,364,097 | 1/1968 | Dunnington | 428/117 |
| 3,554,929 | 1/1971 | Aarons | 428/116 X |
| 3,630,813 | 12/1971 | Allen | 428/117 X |
| 3,755,204 | 8/1973 | Sergeys | 428/116 X |
| 4,054,418 | 10/1977 | Miller et al. | 428/116 X |
| 4,062,036 | 12/1977 | Yoshida | 357/20 X |
| 4,239,819 | 12/1980 | Holzl | 427/255.2 X |
| 4,452,657 | 6/1984 | Hamm | 428/120 X |
| 4,574,459 | 3/1986 | Peters | 425/464 X |

OTHER PUBLICATIONS

Battelle Technical Inputs to Planning Report #38, "Applying Inorganic Coatings: A Vital Technology for Industry".

Primary Examiner—Henry F. Epstein
Attorney, Agent, or Firm—Richard A. Dannells, Jr.; James C. Simmons; William F. Marsh

[57] ABSTRACT

A composite structure having a high stiffness to weight ratio includes a substrate, e.g. graphite, defining at least a pair of outer surfaces which are spaced from each other and having a volume or void passages extending through the substrate between the outer surfaces. At least one stiffening element extends between the outer surfaces within this volume. The stiffening element defines a volume and has at least one wall intersecting each of the outer surfaces. The stiffening element and the outer surfaces are made up of a chemically vapor deposited material having the desired high stiffness to weight ratio and being formed as a monolithic structure having a thickness of at least about 1 millimeter. These structures have such diverse uses as aircraft parts and skis.

5 Claims, 12 Drawing Figures

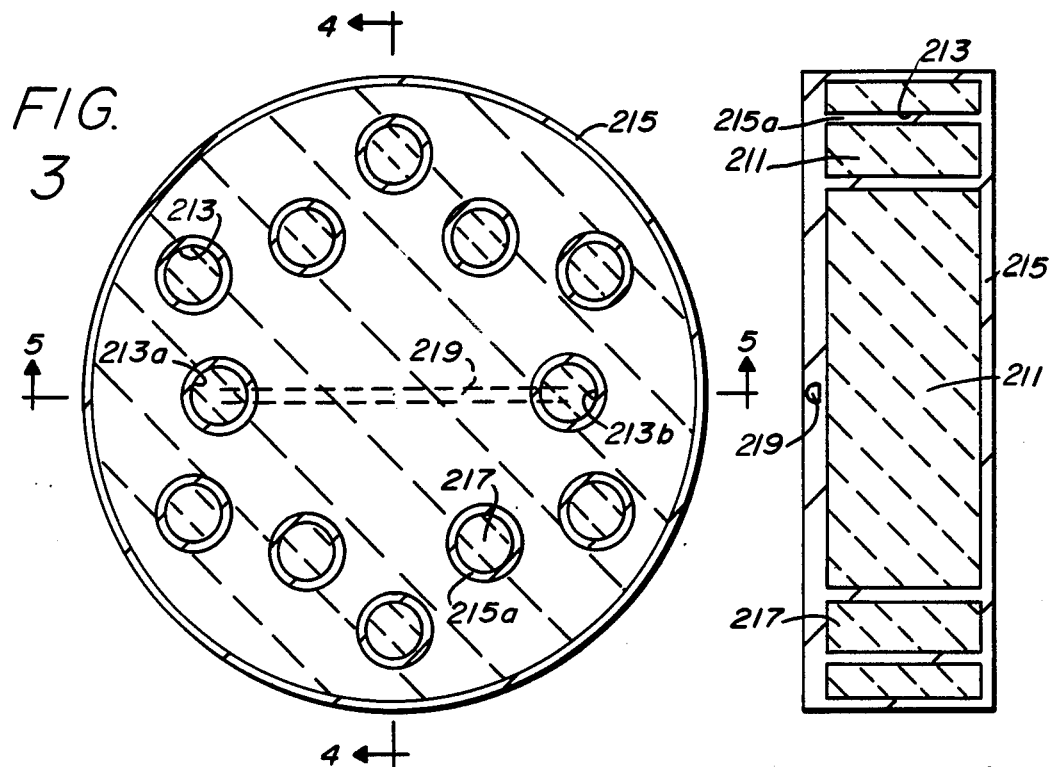
FIG. 3
FIG. 4
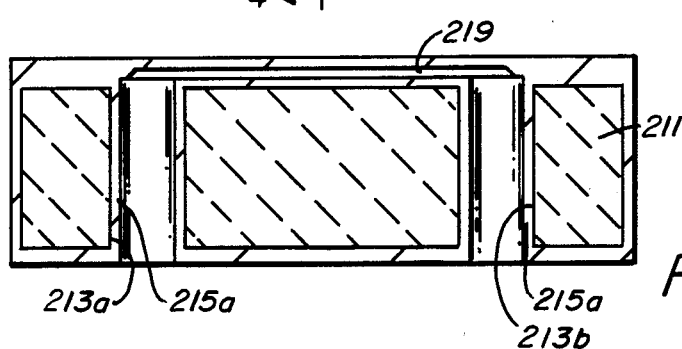
FIG. 5
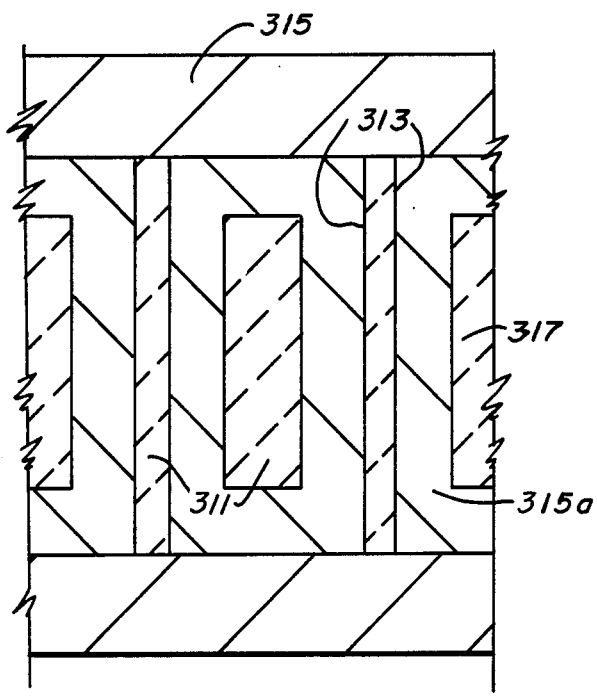
FIG. 6

COMPOSITE STIFF LIGHTWEIGHT STRUCTURE AND METHOD FOR MAKING SAME

The Government of the United States of America has rights in this invention pursuant to Contract No. F29601-84-C-0083 awarded by the U.S. Department of Defense.

This invention relates to structures of high stiffness to weight ratio. More particularly, the invention relates to an improved method for making such structures and to improved structures themselves.

Light weight structures having relatively high rigidity and/or tensile strength are utilized in a variety of applications, including applications as diverse as aircraft parts and skis. One technique for making such structures is to utilize a so-called honeycomb configuration in which a pair of outer sheets are supported in substantially parallel spaced relation to each other by a plurality of stiffening elements, often in the form of hexagonal cells, which extend transversely between the two sheets. Such structures are in widespread use today in many applications.

Certain applications of light weight structures also require that the components made of such materials exhibit extremely high rigidity or stiffness. For example, optical devices frequently require that the optical components possess great dimensional stability. If these optical devices are also to possess the characteristics of light weight, the use of materials which possess a very high stiffness to weight ratio is suggested. Such materials include carbides, nitrides, borides of silicon and titanium, and carbides and nitrides of boron.

Although such light weight, high stiffness materials are regularly used where great dimensional stability combined with light weight is required, such materials are often difficult to consolidate into desired shapes by conventional means. This is because conventional processes such as hot pressing, cold pressing and sintering, or reaction sintering, often leave residual stresses, particularly when it is desired to produce relatively massive bodies. For example, attempts have been made to utilize silicon carbide as a material for mirrors, engine parts and stiff mounts for instruments and the like. However, the use of such materials for these purposes has, as yet, often been unacceptable because of problems of spontaneous cracking in as-sintered material or in subsequent processing. Moreover, such materials, when they are manufactured from the particulate state, are often not sufficiently dense to provide acceptable surface smoothness (e.g. for mirrors). Surface smoothness can be achieved by applying a final coating over a sintered silicon carbide substrate. The coating material, if fully dense, is suitable for grinding and polishing to an appropriate reflecting surface. However, such structures may end up being of relatively heavy weight and thus undesirable.

It would, of course, be advantageous to construct a honeycomb type structure of one or more of the high stiffness to weight materials, such as silicon carbide. However, because of the aforementioned fabrication difficulties, construction of honeycomb-like structures utilizing silicon carbide and similar light weight, high stiffness materials is very difficult and impractical to achieve.

It is an object of the invention to provide an improved structure having a high stiffness to weight ratio.

Another object of the invention is to provide an improved method for making a structure of high stiffness to weight ratio.

Still another object of the invention is to provide a method for making a structure of high stiffness to weight ratio which is relatively low in cost and which avoids problems of cracking due to residual stress.

Another object of the invention is to provide an improved honeycomb-like structure of a relatively dense material having low weight and high stiffness.

BRIEF DESCRIPTION OF THE DRAWINGS

Other objects of the invention will become apparent to those skilled in the art from the following description, taken in connection with the accompanying drawings wherein:

FIG. 3 is a plan full section simplified schematic view of a cooled mirror constructed in accordance with the invention, showing the location of a cooling passage therein in phantom;

FIG. 4 is a sectional view taken along the line 4—4 of FIG. 3;

FIG. 5 is a sectional view taken along the line 5—5 of FIG. 3; and,

FIG. 6 is a full section enlarged view of a portion of a further embodiment of the invention.

Very generally, the method of the invention utilizes a substrate which defines at least a pair of outer surfaces spaced from each other. The word "surface" as used in this context means a surface which ranges in continuity from mostly continuous as on a solid or mostly solid object, to mostly void as on a highly porous or fibrous object. The substrate has void passages extending therethrough between its outer surfaces. These void passages may be manufactured such as in the case of boring holes through a solid object, or may be inherent such as the labyrinthian voids in a porous object. The outer surfaces of the substrate and the surfaces of the passages are coated with a chemical vapor deposited material having a high stiffness to weight ratio and a coefficient of thermal expansion substantially the same as that of the substrate material, said deposited material being formed in a monolithic structure having a thickness of at least about 1 millimeter and closing the void passages at the outer surfaces of the substrate to form continuous surfaces thereat.

Structures of high stiffness to weight ratio produced according to the invention comprise at least a pair of outer substantially continuous surface defining elements which extend spaced from each other and define a volume therebetween. At least one stiffening element extends between the outer surface defining elements within the volume defined thereby. The stiffening element defines a volume and has at least one wall intersecting each of the outer surface defining elements. The stiffening element and the outer surface defining elements comprise a chemical vapor deposited material having a high stiffness to weight ratio and being formed as a monolithic structure having a thickness of at least about 1 millimeter and a Young's modulus of at least about 300 gigaPascals (gPa) ($4.57 \times 10^6$ kg per square centimeter).

More particularly, the substrate upon which the coating is deposited may be of any suitable material capable of maintaining deposition surface integrity at the deposition temperature. The substrate is, of course, shaped in accordance with the ultimate desired configuration of the structure being made. A particularly suitable material for the substrate is a carbonaceous material such as graphite. Typically, the substrate will have at least two outer surfaces spaced from each other (although the surfaces may intersect). In order to provide for stiffening members, as described below, void passages are provided in the substrate extending therethrough between the two outer surfaces.

Referring now particularly to FIGS. 1a–1d, the substrate utilized in the embodiment illustrated comprises a graphite disk 11 in which a plurality of axial passages 13 have been drilled. The opposite planar surfaces of the disk 11 are spaced from each other and the holes 13 comprise void passages which extend through the disk between the two planar outer surfaces of the disk.

Figure 1A:
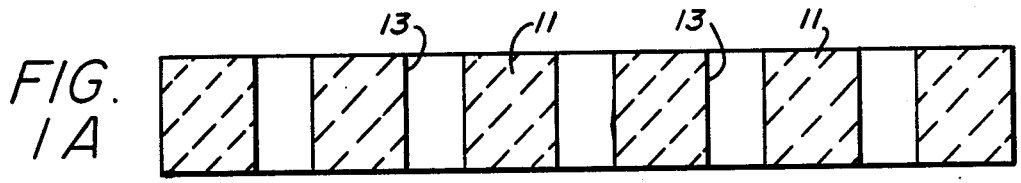
FIGS. 1a-1d illustrate a series of steps in connection with one embodiment of the invention.
Figure 1B:
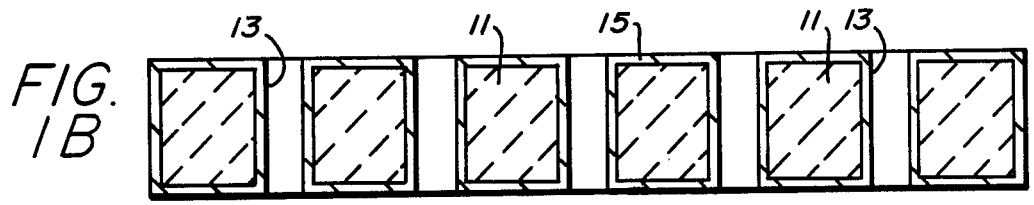

The outer surfaces of the disk substrate 11 and the surfaces of the passages 13 are subjected to chemical vapor deposition (CVD) in a suitable CVD reactor, not shown, to provide a chemical vapor deposited coating 15 as shown in FIG. 1b. With respect to the passages, this coating may be achieved in either of two ways. The first way is to provide for chemical vapor deposition of the coating material simultaneously on the outer surfaces of the substrate and within the passages. The known "throwing power" of chemical vapor deposition will result in a substantially uniform coating within the passages on the walls thereof. The second way in which the passages may be coated is by inserting, in the passages, plugs of a substrate material, such as graphite, which have been previously coated with the chemical vapor deposited material. These plugs mate in the passages, with the chemical vapor deposited material on the outer surfaces of the plugs contacting and lining the passage walls. This, in effect, provides a coating on those walls which is later integrated into the final monolithic coated structure when a chemical vapor deposited coating is applied to the outer surfaces of the substrate and the ends of the plugs. The second way of coating the passages is described more particularly below in connection with FIG. 6.

Figure 1C:
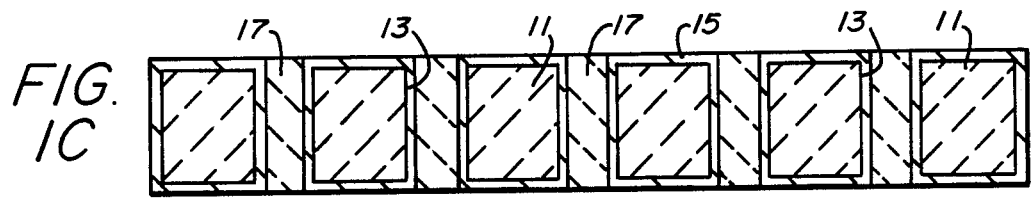

FIG. 1c illustrates the third step in the method of the invention, namely, the plugging of the passages 13 after the walls of the passages have been coated. The plugs 17 are shown in FIG. 1c inserted into the passages 13. The plugs may be of any suitable material capable of maintaining deposition surface integrity at the deposition temperature. Typically, the plugs 17 will be comprised of the same material as the substrate 11, for example, graphite. For a smooth surface in the final product, the ends of the plugs line up with the surface of the deposit 15. If desired, a machining step may be interposed to provide a uniform outer surface.

Figure 1D:
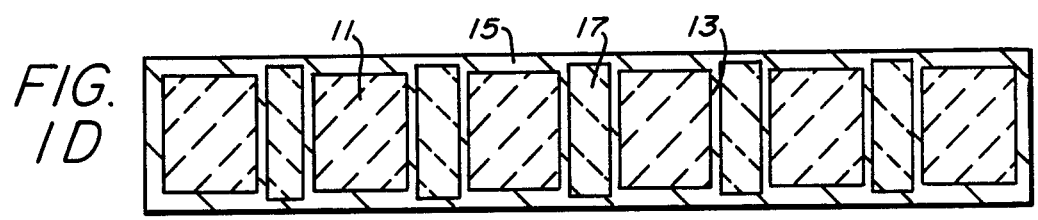

As a final step, the outer surfaces of the substrate are coated once again with a chemical vapor deposited material to a desired thickness. The result is shown in FIG. 1d. The end result is a structure in which a continuous layer of deposited material extends on either side of the substrate, with those layers being joined by stiffener elements constituted by the coated walls of the passages extending through the substrate. The structure is monolithic in the sense that the subsequent chemically vapor deposited material grows directly or epitaxially on the previous layers resulting in a full strength bond. Thus, the tensile strength (and the molecular structure) is substantially uniform throughout the deposited material. The graphite substrate and plugs are therefore essentially encapsulated within the exterior coated surfaces. If it is so desired, the graphite may be removed by providing small holes in the coating and subjecting the graphite to oxidizing temperatures and/or gases.

The material utilized as the chemically vapor deposited coating is preferably a carbide or nitride of silicon and is preferably deposited to a thickness of at least about 1 millimeter. Chemical vapor deposited carbides or nitrides of silicon typically exhibit greater stiffness in bending then more conventional sintered carbides or nitrides. Thus, the material typically exhibits a Young's modulus of at least about 400 gPa in the case of silicon carbide or, in the case of silicon nitride, 350 gPa. Other materials may, of course, be used for coating and substrate provided they are capable of chemical vapor deposition and provided they match the coefficient of thermal expansion of the substrate so as to prevent cracking, spalling, etc. The match required must, of course, meet the thermal expansion conditions when the parts are cooled after deposition. In addition, if the parts are to be used at high temperatures, or be cycled in temperature, materials having appropriate thermal coefficients of expansion should be selected.

Although conventional chemical vapor deposition may be employed to form the deposit in accordance with the invention, it is preferred that the deposit be formed by the chemical vapor deposition process described in U.S. Pat. No. 4,239,819, issued Dec. 16, 1980 and now assigned to the assignee of the present invention. In that patent, a chemical vapor deposition process is described known as controlled nucleation thermochemical deposition (CNTD). The patent describes a method of depositing a hard, fine grained metal or semimetal alloy wherein a volatile halide of the metal or semimetal is partially reduced and then deposited as a liquid phase intermediate compound onto a substrate in the presence of an alloying gas. The liquid phase deposited on the substrate is then thermochemically reacted to produce the hard, fine grained alloy. The so called CNTD TM, CVD deposits have high tensile strength and hardness in addition to being stiff and light weight.

In Example 11 of that patent, the production of deposits of fine grained silicon carbide are achieved by utilizing, in a chemical vapor deposition reactor, a flow of silicon tetrachloride at a rate of 300 ml per minute mixed with a hydrogen stream of at least 300 ml per minute. The gas mixture is heated to a temperature of 600° C. and a stream of propane at 68 ml per minute is then added to the stream and the mixed gases are passed over a heated substrate. At a substrate temperature of 1150° C. and a pressure of 500 Torr, silicon carbide is deposited at a rate of 0.25 mm per hour. Such silicon carbide has an average grain size of 0.05 microns, a hardness of 4200 $HV_{500}$ and a rupture of modulus in bending of 2400 MPa. As deposited, the surface of the material is extremely smooth and the general appearance vitreous.

In Example 13 of the aforementioned patent, silicon nitride ($Si_3N_4$) is produced utilizing a mixture of silicon tetrachloride at 275 ml per minute with a like flow of hydrogen, premixed and heated to 600° C. 100 ml per minute of ammonia, preheated to the same temperature, is then added with the total mixture being passed over a substrate at a temperature of 1250° C. and a pressure of 75 Torr. The crystallites of the deposit were less than 1 micrcn in diameter with a smooth botrioidal surface topography.

In Example 1 of the aforementioned patent, titanium boride is deposited. An 8:1 volume ratio mixture of hydrogen and boron trichloride is passed over the substrate at a temperature of 950° C. at a pressure of 200 l Torr for 15 minutes. This produces a boron diffusion coating. The substrate is then heated to a temperature of 750° C. and maintained at a pressure of 200 Torr. Titanium tetrachloride at a flow rate of 100 milliliters per minute (ml/min) is passed through a bed of titanium chips at the same pressure, heated to 850° C. Boron tetrachloride at a flow of 400 ml/min and hydrogen at a flow of 800 ml/min are mixed with the effluent from the chip bed and passed into the reactor furnace without cooling. In 40 minutes, a smooth, bright coating of 25 micron thickness adherent to the substrate is produced.

In FIGS. 2a-2d, the invention is illustrated in connection with a substrate 111 comprised of a plurality of carbon fibers which are woven or otherwise twisted together to form a substrate structure. The carbon fibers, of course, are separated by voids which constitute a labyrinth of passages extending from the opposite surfaces of the substrate.

Figure 2A:
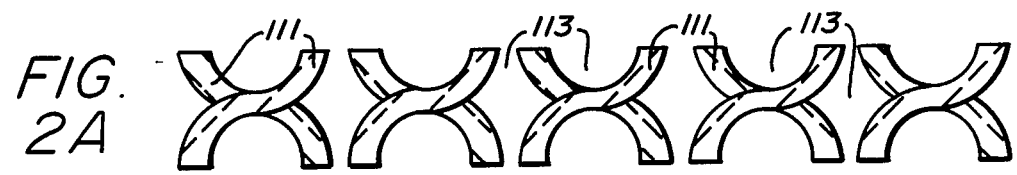
FIGS. 2a-2d illustrate a series of steps in connection with a further embodiment of the invention.
Figure 2B:
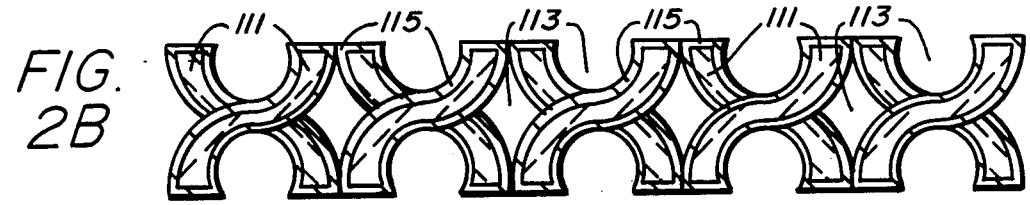
Figure 2C:
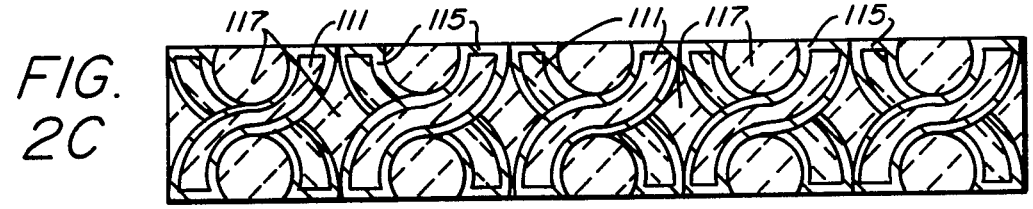

In FIG. 2b, the initial step of the process is illustrated wherein a chemical vapor deposited coating of a high strength and stiffness, light weight material is deposited. This is indicated at 115. In order to fill the interstices or passages 113, the coated fiber structure is impregnated with a resin 117 and carbonized. After impregnation with the resin 117, it may be necessary to machine or otherwise clean off the opposite surfaces of the substrate so that the coated ends are fully exposed for the next coating step.

Figure 2D:
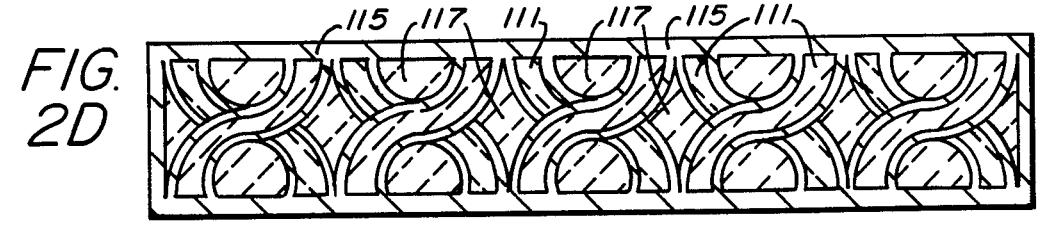

FIG. 2d shows the final coating step wherein a layer of CVD material is deposited on the substrate in a manner which fuses the coating already existing on the fibers into the final coating on the outer layer of the substrate.

In the case of some types of porous structures, the filling step may not be necessary. For certain materials, deposition rates and conditions can be varied to first coat the interstices and then bridge over the voids to form a continuous coating on the outer surfaces of the substrate.

It can be seen that the light weight, stiff structures may have relatively few stiffeners formed by deposition of massive thicknesses of stiff material or may have relatively many stiffeners formed by very thin deposits. The perforated plate arrangement is an example of the former. The infiltrated felt is an example of the latter. The specific amount (i.e. thickness) of deposit, in either case, is determined by the stiffness versus weight requirements. In the case of substrates having very fine porosity, as in the case of a felt structure, low deposition rates are typically required for proper infiltration. Rates of from about 5 $\mu$m to 30 $\mu$m per hour are suitable. For the final coating which closes off the remaining pores on the surface of a porous structure, much higher deposition rates are used to cause bridging over. Rates of 250 to 500 $\mu$m per hour are typical. Deposition rates may be controlled by part temperature or by the partial pressures of active deposition species.

It will be apparent to those skilled in the art that other types of substrates may be coated in accordance with the invention provided the porosity is such as to permit infiltration of the CVD deposit to result in the walls formed by the deposit extending between the opposite surfaces of the substrate. Other types of substrates which may be employed, therefore, include carbon sponge, titanium sponge, and porous silicon carbide.

Referring now more particularly to FIGS. 3-5, the invention is shown schematically in an embodiment comprising a laser mirror in the form of a generally flat circular disk. The illustrated structure includes a circular graphite disk substrate 211 in which a plurality of passages 213 are bored between the two exterior circular surfaces of the disk. The passages 213 are of circular cross section and have axes perpendicular to the circular surfaces of the disk. The disk substrate 211 is first coated with a chemical vapor deposited material, concurrently coating all surfaces including the interior surfaces of the passages 213 to form a deposited layer 215 over the exterior of the substrate and a continuous or monolithic layer 215a within the passages 213. Subsequent to this coating, plugs 217 of a substrate material (e.g. carbon) are inserted in the passages 213 to fill the remaining void within the coated walls 215a. A further massive deposit of chemical vapor deposited material is then placed down to increase the thickness of the layer 215 and to fill in the region over the ends of the plugs 217. The result may be readily seen by viewing FIG. 4.

By viewing FIGS. 3, 4 and 5, it may be seen that a coolant conduit is formed extending between two of the bores or passages, which are designated 213a and 213b. The conduit is merely a schematic representation and it is to be understood that, for cooling purposes, many conduits would typically by provided in a manifolded arrangement. The location of the conduit is indicated in phantom at 119 in FIG. 3 and is shown in actuality in FIGS. 4 and 5. The conduit is formed by utilizing a half-round elongated graphite insert (not shown) which is positioned to extend across the top of the outer layer of the substrate after the first coating is put down. The ends of the graphite insert rest on the uncoated top ends of the plugs 217. The second overlay coating covers the graphite insert, which is then removed along with the plugs from the holes or passages 213a and 213b. This leaves the conduit 119 extending between the passages 213a and 213b. If desired, the graphite substrate 111 may be subsequently removed as described earlier.

Referring to FIG. 6, the previously described alternative method of constructing a structure in accordance with the invention may be seen. Here, the graphite core or substrate is provided with a plurality of bores or transverse passages 317 extending between its upper and lower surfaces. Plugs 317 are then inserted in the passages. The plugs 317 have, on their exterior cylindrical surfaces, a coating 315a of chemical vapor deposited material which then lines the walls of the passages 313. A final coating 315 of chemical vapor deposited material is then put down on the outside of the substrate which grows to form a full strength bond on molecularly uniform material 315a to form a monolithic structure essentially identical to that described in connection with FIGS. 1a-d.

To further illustrate the invention the following specific examples are set forth. A conventional CVD deposition system was used for this work. The system was comprised of the following:

A. A source of high purity bottled hydrogen. Manifold gas was purified by platinum catalyst and molecular sieve.

B. Source of high purity argon and nitrogen from a cryogenic liquid storage.

C. Source of high purity methyltrichlorosilane (in lieu of silicon tetrachloride and a hydrocarbon).

D. Multi-point temperature control by Barber-Coleman Mod 540 Controller.

E. Dispensing systems for each of the above gases using Tylan mass flow controllers including mass flow controlled bubbler for methyltrichlorosilane.

F. Quartz envelope for reactor.

G. Water jet exhauster pumping and scrubbing system for effluent.

The SiC was deposited in accordance with the following reaction:

$$CH_3SiCl_3 \rightarrow SiC + 3\ HCl$$

EXAMPLE 1

A 25 mm thick graphite disc 10 cm in diameter was perforated with 12.5 mm diameter holes on a 7.5 cm "bolt" circle with the disc. This part (designated No. 1) was mounted on a rack to allow the face, periphery, and the through holes to be coated. In the first run, 5657-427 (see Table 1), a 1270 μm thick uniform coating was applied to the face, with a 950 μm coating through the holes. A slight taper was observed in the holes end-to-end, thicker near the front face.

For the next run the part was inverted face-for-face. This was run 5657-428. Unfortunately, a thermocouple failed after 75 minutes and a premature shutdown was necessary. After repair of the thermocouple, the run was continued for an additional 180 minutes. A 1015 μm thick coating was observed as a result of the two sections of this run. The second section of the run was designated 5657-429.

The part was then flat ground on both sides, sectioned and examined metallographically. Interlayer adhesion appeared excellent and the coating was sufficiently uniform to suggest that these operations constituted a viable method of manufacture.

EXAMPLE 2

Six runs were conducted to coat graphite rounds with silicon carbide. The rounds were 1 cm in diameter and 15 cm long. Three parts were included in each run. Approximately 1½ mm coating of silicon carbide was applied in 450 minutes for each run. Parts were then cylindrically ground to a uniform 1.25 mm thickness and cut to 25 mm in length. These short composite columns were prepared as plugs.

Runs 5657-430 and 5657-431 were used to apply a 1145 μm thick coating on either face of Part No. 2. Part No. 2 was identical to Part No. 1 except that the holes were plugged with the short composite cylinders so that no coating entered therein. It should be noted, however, that the composite cylinders were comprised of graphite rods coated with silicon carbide as in FIG. 6.

Following the application of these coatings, both sides of the specimen were ground flat. One side was also finished to a "good" surface. "Good" was defined as ready for polishing. Some "print through" of the plugs was still observable on the "good" surface. For this reason, it was determined that additional SiC deposits (Run 5759-432) should be applied to provide a polishable surface. An additional 380 μm of silicon carbide was deposited and the part finished by grinding. At this point the print through was not observable.

EXAMPLE 3

All runs in this example involved the manufacture of an experimental prototype (part No. 3). Part No. 3 differed from the earlier parts in that a second row of stiffeners was introduced by drilling b 6 holes on a 5.6 cm bolt circle in addition to the holes oriented as in Parts No. 1 and 2. This part then had the appearance of that shown in FIG. 1a.

The next 2 succeeding runs applied 1900 μm and 1830 μm to the two faces of the disc. The surfaces were ground and the holes plugged with graphite cylinders. In the 5759-435 run, 1780 μm of silicon carbide was deposited on one side and that side ground flat again.

The part was inverted for the next run. At 120 minutes another thermocouple failure was experienced. At that point, 1270 μm had been applied to the surface. That surface was ground and an additional 1270 μm applied.

The heat exchange passage was ground into the approximately 2500 μm thick layer of SiC to approximately ½ the thickness of the deposit. It was filled with a leachable graphite core as were the mainfold passages (holes 113a and 113b in FIG. 3). p In run 5657-438, an additional 1270 μm was deposited and the part examined to check the fixation of the core material. Examination provided fixation was satisfactory.

Following this, an additional 1900 μm of SiC was applied and the surface ground flat. The surface appeared satisfactory. In order to assure that sufficient material could be applied to the faces, an additional run was made (5657-440), in which an additional 1900 μm was applied and again, the surface was ground flat.

The deposits in all of the preceding experiments were made at conditions which were optimized for relatively high deposition rate with reasonable grain refinement.

EXAMPLE 4

The purpose of the next run was to demonstrate that a fine grain CNTD ™ material could be deposited on outer surface to assure the best material for polishing to great smoothness. In run -441, deposition was started at the usual temperature (1250° C.) and the temperature gradually reduced to produce an extremely fine grain material. The part was finished ground and produced a surface which appeared to be totally suitable for polishing.

All finishing operations were successful. The part as regularly checked during finishing for microcracking by dye penetrant examination. The following Table 1 summarizes the foregoing examples, indicating the conditions and the results for each run.

TABLE I

| | | | | | |
|---|---|---|---|---|---|
| | | | Chemical Vapor Deposition Runs on Experimental Substrates | | |
| Run No. | Part No. | Temp °C. | Pressure torr | Run Duration min. | Results |
| 5657-427 | 1 | 1275 | 100 | 220 | Deposit (face) 1270 μm, one side Deposit (holes) 953 μm |
| -428 | 1 | 1275 | 65 | 75 | Run foreshortened (thermocouple failure) |
| -429 | 1 | 1275 | 90 | 180 | Deposit (opposing face) 1143 μm from -428 and -429; |

TABLE I-continued

Chemical Vapor Deposition Runs on Experimental Substrates

| Run No. | Part No. | Temp °C. | Pressure torr | Run Duration min. | Results |
|---|---|---|---|---|---|
| | | | | | Deposit (holes) 826 μm |
| -430 | 2 | 1275 | 100 | 180 | Deposit 1143 μm, one side |
| -431 | 2 | 1275 | 100 | 180 | Deposit 1143 μm, opposing side |
| -432 | 2 | 1275 | 100 | 60 | Deposit 381 μm, on ground face from -431, good interlayer adhesion |
| -433 | 3 | 1235 | 100 | 240 | Deposit (face) 1905 μm Deposit (holes) 978 μm |
| -434 | 3 | 1235 | 100 | 240 | Deposit (face) 1829 μm, opposing side Deposit (holes) 1194 μm |
| -435 | 3 | 1235 | 100 | 210 | Deposit (face) 1778 μm over ground surface with plugged holes |
| -436 | 3 | 1235 | 100 | 120 | Run foreshortened (T.C. failure) Deposit (face) 1270 μm, opposing side good interlayer adhesion |
| -437 | 3 | 1237 | 100 | 120 | Deposit (face) 1270 μm same side good layer adhesion |
| -438 | 3 | 1237 | 100 | 120 | Deposit 1270 μm, to check fixation of exchanger core. Good fixation. |
| -439 | 3 | 1237 | 100 | 180 | Additional 1900 μm deposit over heat exchanger. Good interlayer adhesion. |
| -440 | 3 | 1237 | 100 | 180 | Additional 1900 μm deposit over heat exchanger. Good interlayer adhesion. |
| -441 | 3 | 1250 | 100 | 30 | Grain refinement achieved |
| | | 1200 | 100 | +30 | for polishable surface |
| | | 1175 | 100 | +120 | deposit 762 μm |

EXAMPLE 5

This example illustrates the use of a porous substrate in accordance with the invention. A five cm. diameter disc of graphite felt was compressed to 1 cm. thick and a density of approximately 0.2 g/cc. The graphite susceptor was induction heated. The cavity contained a plenum downstream which was continuously evacuated by means of a number of small holes. The substrate, which was heated by radiation and conduction from the inductively heated susceptor, was brought to 1100° C.

A flow of 500 ml/min of methyltrichlorosilane, 2000 ml/min of hydrogen, 75 ml/min of methane, and 200 ml/min of nitrogen was run through the porous substrate at a total pressure of 20 Torr for 60 minutes.

The substrate 10 μm graphite fibers of the belt substrate were uniformly coated with approximately 10 μm of adherent, dense silicon carbide. An overcoating by methods described earlier to provide a external sheath may then be added.

It may be seen, therefore, that the invention provides a unique honeycomb-like structure comprised of a chemically vapor deposited material in a monolithic form having extraordinarily high stiffness to weight ratio. The substrate upon which the structure is formed may remain encapsulated within the structure or may be removed, as desired. In particular, problems of residual stress common in connection with sintered bodies of light weight, high stiffness materials are avoided. Various configurations are readily achieved, including capturing cooling passages and manifolds. High densities and superior surface characteristics are readily achieved.

Various modifications of the invention in addition to those shown and described herein will become apparent to those skilled in the art from the foregoing description and accompanying drawings. Such modifications are intended to fall within the scope of the appended claims.

What is claimed is:

1. A lightweight structure having a high stiffness to weight ratio comprising, at least a pair of outer surface defining elements extending spaced from each other to define a volume therebetween and comprising substantially planar and substantially parallel members, and at least one stiffening element extending between said outer surface defining elements within the volume defined thereby, said stiffening element defining a volume and being substantially cylindrical and the axis of which intersects said parallel members at substantially a right angle and having at least one wall intersecting each of said outer surface defining elements, said stiffening element and said outer surface defining elements comprising a chemically vapor deposited material selected from the group consisting of the carbides, nitrides, and borides of silicon and titanium, and carbides and nitrides of boron as a monolithic structure having a thickness of at least about 1 millimeter.

2. A structure according to claim 1 wherein the volume defined by said outer surface defining elements is a void.

3. A structure according to claim 1 wherein the volume defined by said outer surface defining elements is filled with a carbonaceous material.

4. A structure according to claim 1 including a plurality of stiffening elements extending between said outer surface defining elements within the volume defined thereby, said stiffening elements defining a volume and having at least one wall intersecting each of said outer surface defining elements.

5. A structure according to claim 1 wherein said chemical vapor deposited material is comprised of substantially equiaxial grains having an average size of less than about one micron.

* * * * *